US012597932B2

(12) United States Patent
Takeuchi et al.

(10) Patent No.: US 12,597,932 B2
(45) Date of Patent: Apr. 7, 2026

(54) QUBIT CONTROL CIRCUIT

(71) Applicant: National University Corporation YOKOHAMA National University, Yokohama (JP)

(72) Inventors: Naoki Takeuchi, Yokohama (JP); Nobuyuki Yoshikawa, Yokohama (JP)

(73) Assignee: National University Corporation YOKOHAMA National University, Yokohama (JP)

( * ) Notice: Subject to any disclaimer, the term of this patent is extended or adjusted under 35 U.S.C. 154(b) by 0 days.

(21) Appl. No.: 18/842,688

(22) PCT Filed: Feb. 22, 2023

(86) PCT No.: PCT/JP2023/006454
§ 371 (c)(1),
(2) Date: Aug. 29, 2024

(87) PCT Pub. No.: WO2023/167070
PCT Pub. Date: Sep. 7, 2023

(65) Prior Publication Data
US 2025/0183897 A1      Jun. 5, 2025

(30) Foreign Application Priority Data

Mar. 4, 2022      (JP) ................................. 2022-033636

(51) Int. Cl.
*H03K 19/195* (2006.01)
*G06N 10/00* (2022.01)
(Continued)

(52) U.S. Cl.
CPC ........... *H03K 19/195* (2013.01); *G06N 10/00* (2019.01); *H03K 3/38* (2013.01); *H03K 17/92* (2013.01); *H10N 60/12* (2023.02); *G06N 10/40* (2022.01)

(58) Field of Classification Search
CPC ........ H03K 19/195; H03K 3/38; H03K 17/92; H10N 60/12; G06N 10/40; G06N 10/00
(Continued)

(56) References Cited

U.S. PATENT DOCUMENTS

| | | | |
|---|---|---|---|
| 10,651,808 B2 * | 5/2020 | Egan | ......................... H03F 1/02 |
| 2005/0047245 A1 | 3/2005 | Furuta et al. | |

(Continued)

FOREIGN PATENT DOCUMENTS

| | | |
|---|---|---|
| JP | 2005-079663 A | 3/2005 |
| JP | 2010-511946 A | 4/2010 |

(Continued)

OTHER PUBLICATIONS

International Search Report for International Patent Application No. PCT/JP2023/006454 (May 16, 2023).

*Primary Examiner* — Arnold M Kinkead
(74) *Attorney, Agent, or Firm* — Merchant & Gould P.C.

(57)      ABSTRACT

This qubit control circuit includes a first power supply line through which a first excitation current is input, a second power supply line through which a second excitation current is input, a first input signal line through which a first input signal is input, a first pulse train generation circuit that outputs a first pulse train having a repetition frequency corresponding to a frequency of the first excitation current generated by a first Josephson junction on the basis of a frequency of the first excitation current, a waveform of the second excitation current, and a logical state indicated by the first input signal, a second pulse train generation circuit that outputs a second pulse train having a repetition frequency corresponding to the frequency of the first excitation current generated by a second Josephson junction on the basis of the frequency of the first excitation current, and an output pulse train generation circuit that includes a third Josephson junction and outputs an output pulse train in which a
(Continued)

waveform of the first pulse train is shaped by a repetition frequency of the second pulse train.

5 Claims, 7 Drawing Sheets

(51) Int. Cl.
G06N 10/40 (2022.01)
H03K 3/38 (2006.01)
H03K 17/92 (2006.01)
H10N 60/12 (2023.01)

(58) Field of Classification Search
USPC ............................................. 326/3; 341/133
See application file for complete search history.

(56) References Cited

U.S. PATENT DOCUMENTS

| | | | |
|---|---|---|---|
| 2008/0048902 | A1 | 2/2008 | Rylov et al. |
| 2008/0084898 | A1 | 4/2008 | Miyaho et al. |

FOREIGN PATENT DOCUMENTS

| | | |
|---|---|---|
| JP | 2014-529216 A | 10/2014 |
| JP | 2019-521546 A | 7/2019 |
| WO | 2006/040903 A1 | 4/2006 |
| WO | 2008/067664 A1 | 6/2008 |
| WO | 2013/025617 A1 | 2/2013 |
| WO | 2017/192733 A2 | 11/2017 |

* cited by examiner

QUBIT CONTROL CIRCUIT

TECHNICAL FIELD

The present invention relates to a qubit control circuit.

This application is a National Stage Application of PCT/JP2023/006454, filed on Feb. 22, 2023, which claims priority to Japanese Patent Application No. 2022-033636, filed Mar. 4, 2022, and which applications are incorporated herein by reference. To the extent appropriate, a claim of priority is made to each of the above disclosed applications.

BACKGROUND ART

Quantum computers are capable of simulating quantum systems consisting of a large number of electrons and are therefore expected to be applicable to material design and drug discovery. Qubits controlled in a quantum computer are made of superconducting elements and thus need to be controlled at low temperatures. Therefore, the configuration of a quantum computer includes a refrigerator for keeping the qubits at a low temperature and a device that operates at room temperature. The device that operates at room temperature outputs a control signal to the qubits via a cable.

In a quantum computer, a large number of cables are required to control a large number of qubits in a refrigerator. For example, 168 cables are required to control 72 qubits. However, since there is a limit to the number of cables required to control the qubits, it is extremely difficult to increase the number of qubits.

To realize a large-scale quantum computer, control circuits that operate at a low temperature like the qubits are desired. For example, a quantum computing system in which the number of communication lines is smaller than the number of devices to be controlled (Patent Document 1) is known. Also, a superconducting quantum processor including a superconducting digital/analog converter that uses a flux quantum parametron as a shift register (Patent Document 2) is known.

CITATION LIST

Patent Document

Patent Document 1

Published Japanese Translation No. 2010-511946 of the PCT International Publication

Patent Document 2

Published Japanese Translation No. 2019-521546 of the PCT International Publication

SUMMARY OF INVENTION

Technical Problem

As described above, there is a demand for controlling a large number of qubits with a small number of cables. Therefore, there is a demand for a circuit which can serve as an element constituting a qubit control circuit that can control a large number of qubits with a small number of cables.

The present invention has been made in view of the above points and provides a circuit which serves as an element constituting a qubit control circuit that can control a large number of qubits with a small number of cables.

Solution to Problem

The present invention was made to solve the above problems, and one aspect of the present invention is a qubit control circuit including a first power supply line through which a first excitation current, which is a current having a predetermined frequency, is input, a second power supply line through which a second excitation current, which is a current having a predetermined waveform, is input, a first input signal line through which a first input signal indicating a logic state is input, a first pulse train generation circuit including a first Josephson junction and configured to output a first pulse train which is a pulse train generated by the first Josephson junction on the basis of the frequency of the first excitation current, the waveform of the second excitation current, and the logic state indicated by the first input signal, the first pulse train having a repetition frequency corresponding to the frequency, a second pulse train generation circuit including a second Josephson junction and configured to output a second pulse train which is a pulse train generated by the second Josephson junction on the basis of the frequency of the first excitation current, the second pulse train having a repetition frequency corresponding to the frequency, and an output pulse train generation circuit including a third Josephson junction and configured to output an output pulse train in which a waveform of the first pulse train is shaped by the repetition frequency of the second pulse train.

Further, according to one aspect of the present invention, the qubit control circuit may further include a second input signal line through which a second input signal indicating a predetermined logic state is input, and a third power supply line through which a third excitation current that is a direct current having a predetermined magnitude is input, wherein the second pulse train generation circuit may output, as the second pulse train, a pulse train generated by the second Josephson junction on the basis of the frequency of the first excitation current and a DC waveform of the third excitation current.

Further, according to one aspect of the present invention, in the qubit control circuit, the first excitation current input to the first power supply line may include a plurality of frequencies, a set of the first pulse train generation circuit, the second pulse train generation circuit, and the output pulse train generation circuit, and a resonant circuit may be provided for each of the plurality of frequencies, and the resonant circuit may have a resonance frequency that is one of the plurality of frequencies included in the first excitation current and may supply the resonance frequency as the frequency of the first excitation current to the first pulse train generation circuit and the second pulse train generation circuit.

Further, according to one aspect of the present invention, in the qubit control circuit, the number of pulses in the output pulse train output by the output pulse train generation circuit may be controlled by an amplitude of the first excitation current.

Further, according to one aspect of the present invention, in the qubit control circuit, the first pulse train generation circuit and the second pulse train generation circuit may include at least one of a flux quantum parametron circuit configuration and a single flux quantum circuit configuration.

Advantageous Effects of Invention

According to the present invention, it is possible to provide a circuit that is an element constituting a qubit control circuit that can control a large number of qubits with a small number of cables.

BRIEF DESCRIPTION OF DRAWINGS

FIG. 5 is a diagram showing an example of a configuration of a qubit control circuit according to a second embodiment of the present invention.

DESCRIPTION OF EMBODIMENTS

First Embodiment

Figure 1:
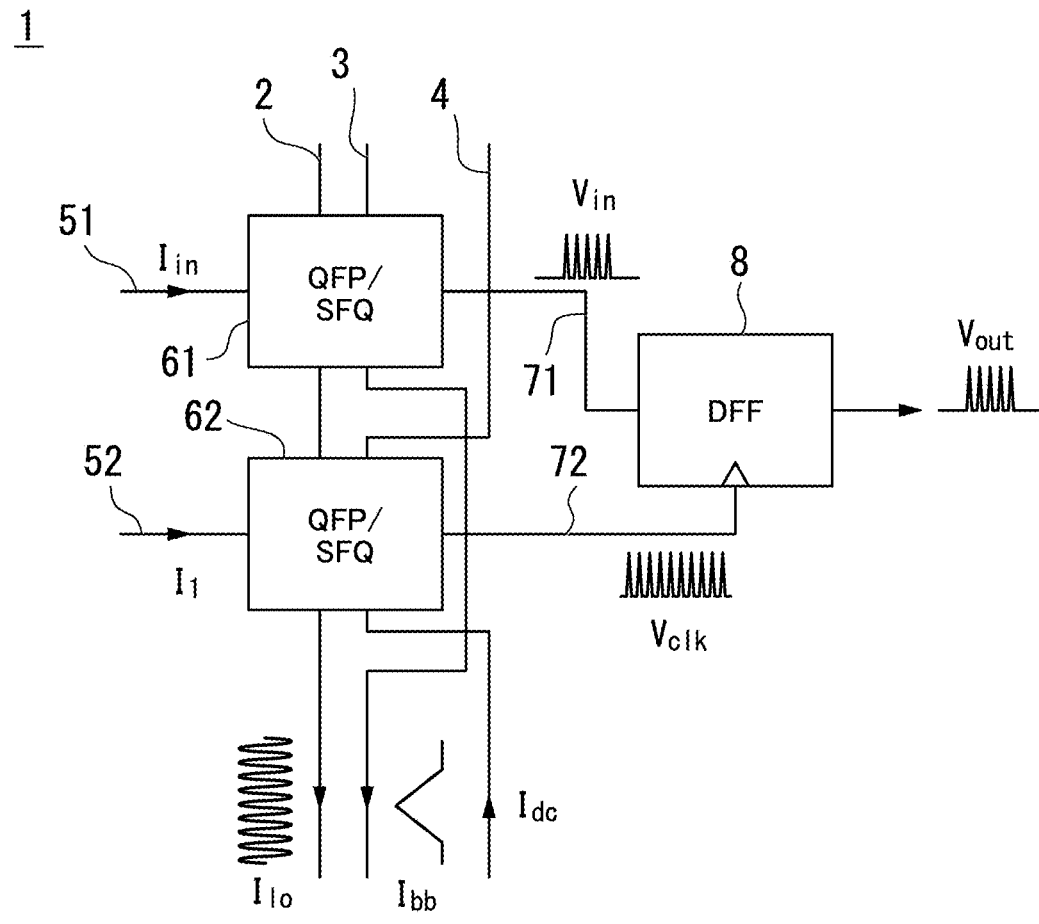
FIG. 1 is a diagram showing an example of a configuration of a qubit control circuit according to a first embodiment of the present invention.

A first embodiment of the present invention will be described in detail below with reference to the drawings. FIG. 1 is a diagram showing an example of a configuration of a qubit control circuit 1 according to this embodiment. The qubit control circuit 1 is a pulse generator that generates a SFQ pulse train. In the qubit control circuit 1, a QFP/SFQ interface is used as an example.

The qubit control circuit 1 includes a first power supply line 2, a second power supply line 3, a third power supply line 4, a first input signal line 51, a second input signal line 52, a QFP/SFQ interface 61, a QFP/SFQ interface 62, a first output signal line 71, a second output signal line 72, and a D flip-flop 8.

The first power supply line 2 is a power supply line through which a first excitation current Ilo is input. The first excitation current Ilo is a current including a predetermined frequency. The frequency of the first excitation current Ilo is, for example, 5 GHz. The first excitation current Ilo is a local oscillator signal supplied from a local oscillator (not shown). The local oscillator is provided separately from the qubit control circuit 1.

The second power supply line 3 is a power supply line through which a second excitation current Ibb is input. The second excitation current Ibb is a current having a predetermined waveform. The second excitation current Ibb is a baseband signal supplied as an output signal from a baseband circuit (not shown). The baseband circuit is provided separately from the qubit control circuit 1. The waveform of the second excitation current Ibb is, for example, a triangular wave.

The third power supply line 4 is a power supply line through which a DC offset current Idc is input. The DC offset current Idc is a direct current having a predetermined magnitude. The DC offset current Idc is supplied from a DC power supply (not shown).

The first input signal line 51 is a control line through which a first input current Iin is input. The second input signal line 52 is a control line through which a second input current I1 is input. The first input current Iin is a current that determines a logic state of the QFP/SFQ interface 61. The second input current I1 is a current that determines a logic state of the QFP/SFQ interface 62.

The QFP/SFQ interface 61 generates a first SFQ pulse train Vin from the first excitation current Ilo. The first power supply line 2, the second power supply line 3, the first input signal line 51, and the first output signal line 71 are connected to the QFP/SFQ interface 61. The QFP/SFQ interface 61 generates the first SFQ pulse train Vin according to the logic state determined by the first input current Iin on the basis of the first excitation current Ilo and the second excitation current Ibb. The QFP/SFQ interface 61 outputs the generated first SFQ pulse train Vin to the D flip-flop 8 via the first output signal line 71.

The QFP/SFQ interface 62 generates a second SFQ pulse train Vclk from the second input current I1. The first power supply line 2, the third power supply line 4, the second input signal line 52, and the second output signal line 72 are connected to the QFP/SFQ interface 62. The QFP/SFQ interface 62 generates the second SFQ pulse train Vclk on the basis of the first excitation current Ilo and the DC offset current Idc. The second SFQ pulse train Vclk is a pulse train having a repetition frequency corresponding to a frequency of the first excitation current Ilo. The QFP/SFQ interface 62 outputs the generated second SFQ pulse train Vclk to the D flip-flop 8 via the second output signal line 72.

Each of the QFP/SFQ interface 61 and the QFP/SFQ interface 62 is a circuit that includes a superconducting element and has a configuration of a quantum flux parametron (QFP) circuit. The circuit configurations of the QFP/SFQ interface 61 and the QFP/SFQ interface 62 will be described below. The QFP/SFQ interface 61 is an example of a first pulse train generation circuit. The QFP/SFQ interface 62 is an example of a second pulse train generation circuit. That is, each of the QFP/SFQ interface 61 and the QFP/SFQ interface 62 is a pulse train generation circuit that includes a QFP configuration and converts a current input to the QFP into a pulse train.

Here, the logic state determined by the second input current I1 is always fixed to "1". The DC offset current Idc is applied to the QFP/SFQ interface 62 in a state in which the logic state determined by the second input current I1 is always fixed to "1". Therefore, the QFP/SFQ interface 62 always generates the second SFQ pulse train Vclk.

The D flip-flop 8 generates an output pulse train Vout by shaping a waveform of the first SFQ pulse train Vin using the repetition frequency of the second SFQ pulse train Vclk. Here, the repetition frequency of the output pulse train Vout is the same as the frequency of the first excitation current Ilo. Since pulse intervals of the first SFQ pulse train Vin are not necessarily uniform, in the qubit control circuit 1, the waveform of the first SFQ pulse train Vin is shaped by the D flip-flop 8. The first SFQ pulse train Vin is generated only during a period in which an amplitude of the second excitation current Ibb is greater than a predetermined value. The first SFQ pulse train Vin does not necessarily have uniform pulse intervals, but the number of pulses in the pulse train is a predetermined number. On the other hand, the second SFQ pulse train Vclk has uniform pulse intervals, but since it is constantly output, the number of pulses in the pulse train does not reach a predetermined number. The D flip-flop 8 generates an output pulse train Vout, which has uniform pulse intervals and a predetermined number of pulses in the pulse train, from the first SFQ pulse train Vin and the second SFQ pulse train Vclk.

As an example, the D flip-flop 8 is a single flux quantum (SFQ) circuit. In the SFQ circuit, a flux quantum generated by an input voltage pulse propagates through a superconducting loop via a Josephson junction. In the SFQ circuit, a voltage pulse generated at both ends of the Josephson junction by the propagation of the flux quantum is output. The D flip-flop 8 is an example of an output pulse train generation circuit.

It is known that the SFQ circuits have no DC resistance and consume low power because they use superconducting elements. A power consumption per gate in the SFQ circuit is about 1 μW. Furthermore, in the SFQ circuit, an ultra-high speed operation with a clock frequency of about 100 GHz is possible. Since the power consumption and operation frequency depend on circuit parameters, values of the power consumption and operation frequency are merely examples.

Figure 2:
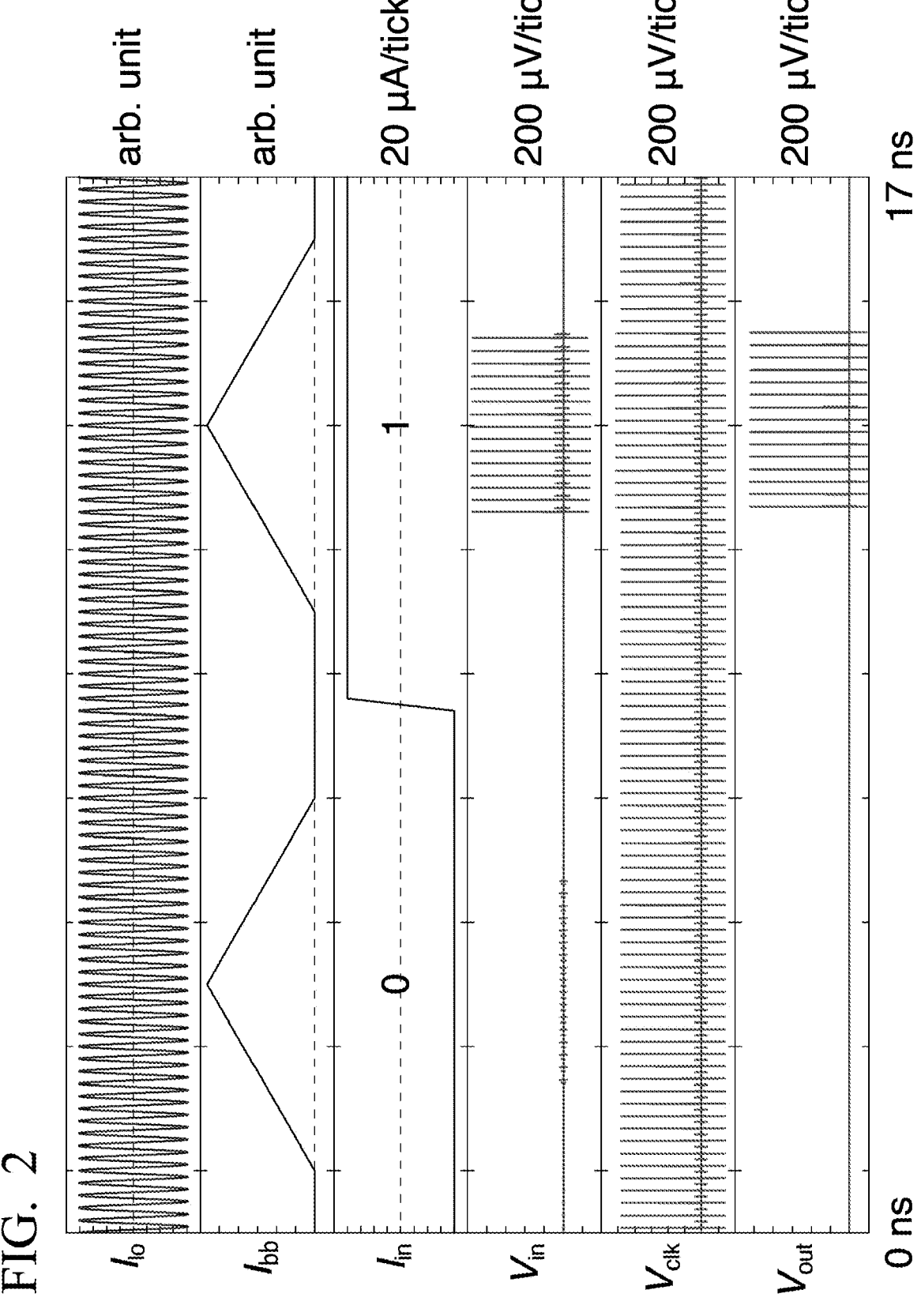
FIG. 2 is a diagram showing an example of a simulation result of the qubit control circuit according to the first embodiment of the present invention.

Now, with reference to FIG. 2, a simulation result using the qubit control circuit 1 will be described. FIG. 2 is a diagram showing an example of a simulation result using the qubit control circuit 1 according to this embodiment. In FIG. 2, a value of each physical quantity is shown for 17 nanoseconds.

The frequency of the first excitation current Ilo is 5 GHz as described above. The second excitation current Ibb is a triangular wave as described above. In FIG. 2, the values of the first excitation current Ilo and the second excitation current Ibb are each indicated in an arbitrary unit.

As an example, the first input current Iin indicates a logic state of "0, 1". In accordance with the logic state, the value of the first input current Iin changes from low to high at around 8.5 nanoseconds. In FIG. 2, the value of the first input current Iin is expressed in units of 20 μA/tick.

As described above, the first SFQ pulse train Vin is generated only during a period in which the amplitude of the second excitation current Ibb is greater than a predetermined value. On the other hand, the second SFQ pulse train Vclk is always generated. The output pulse train Vout is generated on the basis of the first SFQ pulse train Vin and the second SFQ pulse train Vclk. As shown in FIG. 2, in the qubit control circuit 1, an on/off state of the output pulse train Vout is controlled by the logic state indicated by the first input current Iin.

When the pulse intervals of the first SFQ pulse train Vin are compared with the pulse intervals of the output pulse train Vout, while the pulse intervals of the first SFQ pulse train Vin includes non-uniform portions, the pulse intervals of the output pulse train Vout are converted by the D flip-flop 8 to uniform pulse intervals.

In FIG. 2, the unit of each of the values of the first SFQ pulse train Vin, the second SFQ pulse train Vclk, and the output pulse train Vout is 200 μV/tick.

An example of a circuit configuration of the QFP/SFQ interface 61 or the QFP/SFQ interface 62 shown in FIG. 1 will now be described with reference to FIGS. 3 and 4. The circuit configuration of the QFP/SFQ interface 61 or the QFP/SFQ interface 62 shown in FIG. 1 is, for example, either the circuit configuration of the QFP/SFQ interface shown in FIG. 3 or FIG. 4. The circuit configuration of the QFP/SFQ interface shown in FIGS. 3 and FIG. 4 is an example, and the circuit configuration of the QFP/SFQ interface 61 or the QFP/SFQ interface 62 shown in FIG. 1 may be a circuit configuration of a QFP/SFQ interface other than the circuit configuration of the QFP/SFQ interface shown in FIG. 3 or FIG. 4.

Figure 3:
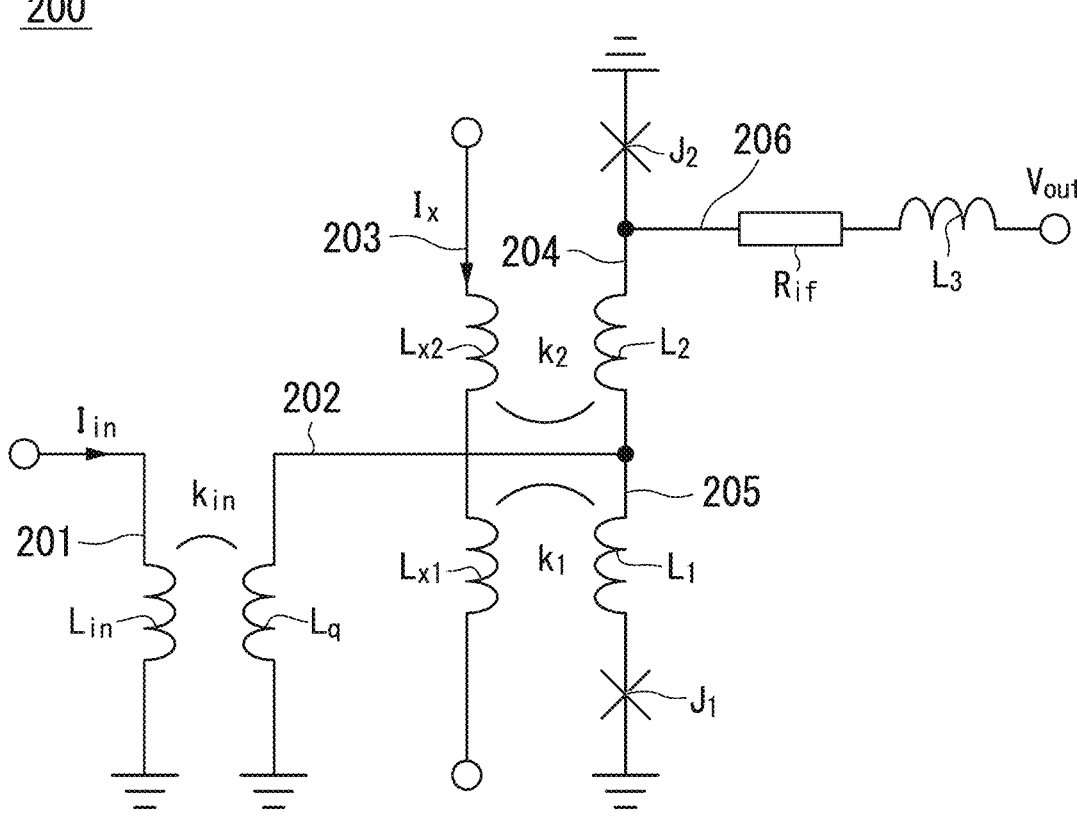
FIG. 3 is a diagram showing an example of a circuit configuration of a QFP/SFQ interface according to the first embodiment of the present invention.
Figure 4:
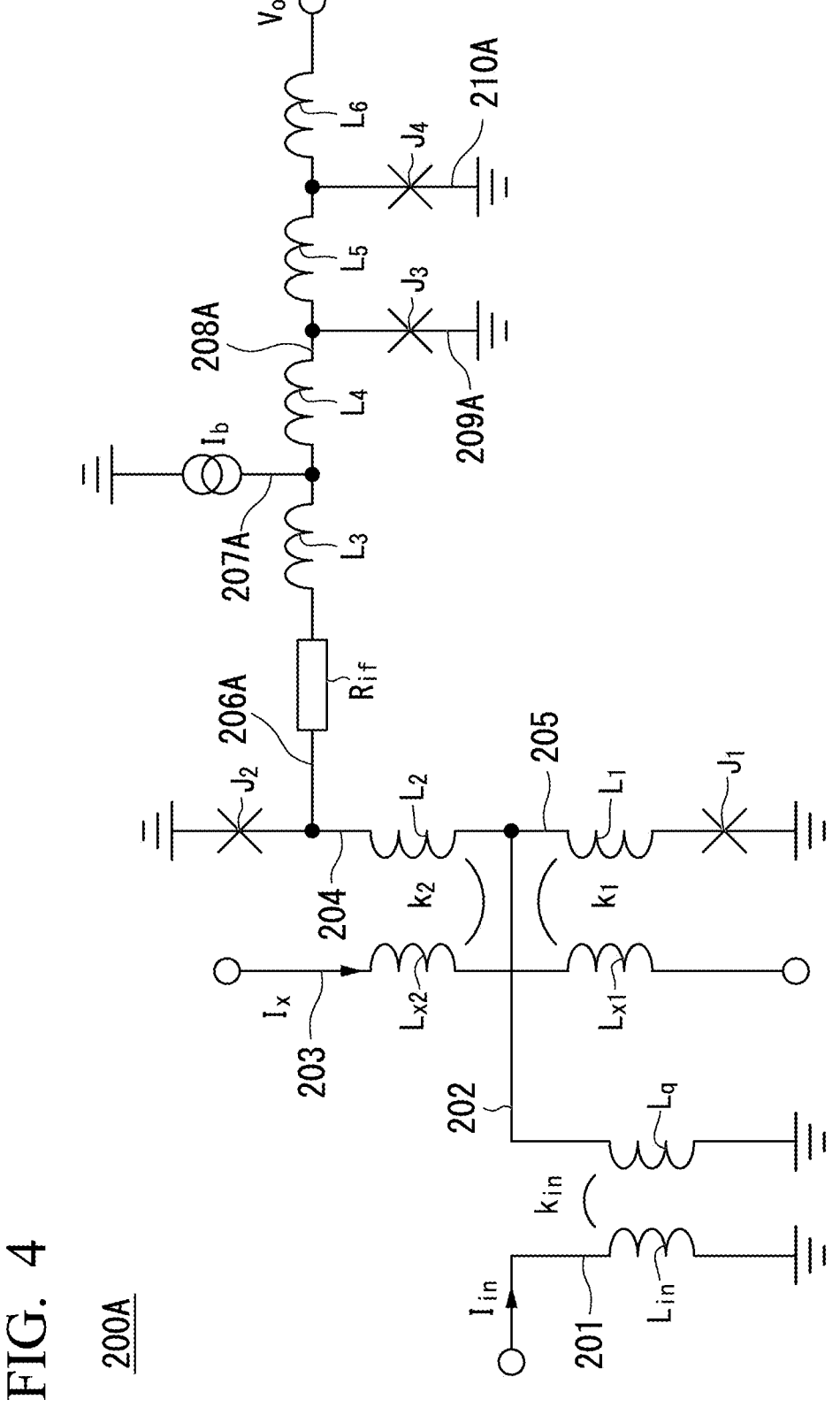
FIG. 4 is a diagram showing an example of the circuit configuration of the QFP/SFQ interface according to the first embodiment of the present invention.

FIG. 3 is a diagram showing an example of a QFP/SFQ interface 200 which is a circuit configuration of the QFP/SFQ interface 61 or the QFP/SFQ interface 62 according to this embodiment. The QFP/SFQ interface 200 is driven and clocked by an interface excitation current Ix. When the interface excitation current Ix flows through a power supply line 203, a magnetic flux is generated in each of inductors Lx1 and Lx2 provided in the power supply line 203. The power supply line 203 corresponds to the first power supply line 2 in FIG. 1. The interface excitation current Ix corresponds to the first excitation current Ilo in FIG. 1. In addition, while the qubit control circuit 1 (FIG. 1) has two power supply lines (the first power supply line 2 and the second power supply line 3), the QFP/SFQ interface 200 (FIG. 3) is described as having one power supply line (a power supply line 203) for ease of explanation.

The inductor Lx1 and an inductor L1 provided in a circuit element 205 are magnetically coupled by a coupling constant k1. The inductor Lx2 and an inductor L2 provided in a circuit element 204 are magnetically coupled by a coupling constant k2. A Josephson junction J1 is provided in the circuit element 205. A Josephson junction J2 is provided in the circuit element 204.

Here, when the first input current Iin flows through an input signal line 201, a magnetic flux is generated in an inductor Lin provided in the input signal line 201. The input signal line 201 corresponds to the first input signal line 51 in FIG. 1. The first input current Iin corresponds to the first input current Iin in FIG. 1. The inductor Lin and an inductor Lq provided in a circuit element 202 are magnetically coupled by a coupling constant kin. A current flows through the circuit element 202 in accordance with the first input current Iin flowing through the input signal line 201.

When a magnetic flux is applied to the inductor L1 and the inductor L2, a pair of Josephson junctions, namely, a Josephson junction J1 and a Josephson junction J2, determines a logic state in accordance with the first input current Iin flowing through the input signal line 201, and converts the first input current Iin into a voltage pulse signal Vout.

When the first input current Iin is positive (the logic state of "1"), the Josephson junction J2 switches to generate a voltage pulse, and the voltage pulse signal Vout is output at an output end of an output signal line 206. On the other hand, when the first input current Iin is negative (the logic state of "0"), the Josephson junction J 1 switches and no voltage pulse signal Vout is output to the output end of the output signal line 206. In this manner, in the QFP/SFQ interface 200, the first input current Iin is converted into the voltage pulse signal Vout. Here, a voltage pulse generated by switching of the Josephson junction is output as the voltage pulse signal Vout from the output end of the output signal line 206 via a resistor Rif and an inductor L3. The output signal line 206 corresponds to the first output signal line 71 in FIG. 1.

FIG. 4 is a diagram showing an example of a QFP/SFQ interface 200A which is the circuit configuration of the QFP/SFQ interface 61 or the QFP/SFQ interface 62 according to this embodiment. Comparing the QFP/SFQ interface 200A (FIG. 4) with the QFP/SFQ interface 200 (FIG. 3), there are differences in a signal current line 206A, a bias current line 207A, a circuit element 208A, a circuit element 209A, and a circuit element 210A. The bias current line 207A, the circuit element 208A, the circuit element 209A, and the circuit element 210A amplify the voltage pulse signal in the QFP/SFQ interface 200 (FIG. 3). Here, the other components (the input signal line 201, the circuit element 202, the power supply line 203, the circuit element 204, and the circuit element 205) are the same as those in the QFP/SFQ interface 200 (FIG. 3). Description of the same configuration as in the QFP/SFQ interface 200 (FIG. 3) will be omitted, and in FIG. 4, the description will focus on the parts that differ from the QFP/SFQ interface 200 (FIG. 3).

The voltage pulse generated via the Josephson junction J1 and the Josephson junction J2 is converted into a current by the resistor Rif and the inductor L3 provided in the signal current line 206A, and the converted current is output to the circuit element 208A.

The circuit element 208A includes an inductor L4, an inductor L5, and an inductor L6. The circuit element 209A including a Josephson junction J3 is connected between the inductors LA and L5. The circuit element 210A including a Josephson junction J4 is connected between the inductors L5 and L6.

When a current is input from the signal current line 206A to the circuit element 208A, a flux quantum propagates through the superconducting loop via the Josephson junction J3 and the Josephson junction J4, and during the propagation process, when the flux quantum passes through a Josephson junction, a voltage pulse is generated at both ends of the Josephson junction. A voltage pulse signal Vout generated at both ends of the Josephson junction J4 is output as an output signal.

In the QFP/SFQ interface, in accordance with various parameters for the circuit, it is determined whether or not the voltage pulse is generated by the Josephson junction. The parameters include a magnitude of an inductance of the inductor, parameters of the Josephson junction, and the like.

In the QFP/SFQ interface 200 shown in FIG. 3, the parameters including the magnitude of the inductance of each of the inductor L1, the inductor L2, and the inductor Lq, the critical current value of each of the Josephson junctions J1 and J2, and the like are adjusted so that the voltage pulse signal Vout is generated by the Josephson junction J1 and the Josephson junction J2.

Similarly, in the QFP/SFQ interface 200A shown in FIG. 4, the parameters including the magnitude of the inductance of each of the inductor L1, the inductor L2, the inductor L3, the inductor LA, the inductor L5, the inductor L6, and the inductor Lq, and the critical current value of each of the Josephson junction J1, the Josephson junction J2, the Josephson junction J3, and the Josephson junction J4 are adjusted so that the voltage pulse signal Vout is generated by the Josephson junction J3 and the Josephson junction J4.

As for the QFP/SFQ interface 61 and the QFP/SFQ interface 62 shown in FIG. 1, various parameters for the circuit are adjusted so that voltage pulse signals (the first SFQ pulse train Vin, the second SFQ pulse train Vclk) are generated by the Josephson junction.

In this embodiment, the example in which the qubit control circuit 1 generates a pulse train by including the QFP/SFQ interfaces (the QFP/SFQ interface 61, the QFP/SFQ interface 62) has been described, but the present invention is not limited thereto. The qubit control circuit 1 may include an SFQ circuit instead of the QFP/SFQ interface. In that case, the qubit control circuit 1 generates a pulse train by the SFQ circuit. Furthermore, the qubit control circuit 1 may include a superconducting circuit other than the QFP/SFQ interface or the SFQ circuit instead of the QFP/SFQ interfaces (the QFP/SFQ interface 61, the QFP/SFQ interface 62), as long as that superconducting circuit generates a pulse train.

Further, in this embodiment, the example has been described in which the first power supply line 2, the third power supply line 4, the second input signal line 52, and the second output signal line 72 are connected to the QFP/SFQ interface 62, and the QFP/SFQ interface 62 generates the second SFQ pulse train Vclk having a repetition frequency corresponding to the frequency of the first excitation current Ilo on the basis of the first excitation current Ilo and the DC offset current Idc, but the present invention is not limited thereto.

As long as the second SFQ pulse train Vclk having a repetition frequency corresponding to the frequency of the first excitation current Ilo is generated by a superconducting circuit, a circuit other than the QFP/SFQ interface 62 may be provided instead of the QFP/SFQ interface 62.

Even when a circuit other than the QFP/SFQ interface 62 is provided, preferably the first power supply line 2 through which the first excitation current Ilo flows is connected to the circuit in order to reduce the number of cables. For example, a circuit in which the third power supply line 4 and the second input signal line 52 are not connected and the second SFQ pulse train Vclk having a repetition frequency corresponding to the frequency of the first excitation current Ilo is generated by a superconducting circuit on the basis of the first excitation current Ilo may be provided instead of the QFP/SFQ interface 62.

A circuit in which the first power supply line 2, the third power supply line 4, and the second input signal line 52 are not connected, and the second SFQ pulse train Vclk having a repetition frequency corresponding to the frequency of the first excitation current Ilo is generated by a superconducting circuit may be provided instead of the QFP/SFQ interface 62.

Further, in this embodiment, the example has been described in which the qubit control circuit 1 includes the D flip-flop 8 and outputs the output pulse train Vout by shaping of a waveform of the first SFQ pulse train Vin using a repetition frequency of the second SFQ pulse train Vclk, but the present invention is not limited thereto. In the case of a superconducting circuit that outputs the output pulse train Vout in which a waveform of the first SFQ pulse train Vin is shaped by the repetition frequency of the second SFQ pulse train Vclk, the qubit control circuit 1 may include a superconducting circuit other than the D flip-flop 8 instead of the D flip-flop 8.

Summary of the First Embodiment

As described above, the qubit control circuit 1 according to this embodiment includes a first power supply line 2, a second power supply line 3, a first input signal line 51, a first pulse train generation circuit (in this embodiment, the QFP/SFQ interface 61), a second pulse train generation circuit (in this embodiment, the QFP/SFQ interface 62), and an output pulse train generation circuit (in this embodiment, the D flip-flop 8).

A first excitation current Ilo which is a current with a predetermined frequency is input to the first power supply line 2.

A second excitation current Ibb which is a current with a predetermined waveform is input to the second power supply line 3.

A first input signal (in this embodiment, the first input current Iin) indicating a logic state is input to the first input signal line 51.

The first pulse train generation circuit (in this embodiment, the QFP/SFQ interface 61) includes a first Josephson junction (in this embodiment, for example, the Josephson junction J1 and the Josephson junction J2 shown in FIG. 3), and outputs a first pulse train (in this embodiment, the first SFQ pulse train Vin) which is a pulse train generated by the first Josephson junction (in this embodiment, for example, the Josephson junction J1 and the Josephson junction J2 shown in FIG. 3) on the basis of the frequency of the first excitation current Ilo, the waveform of the second excitation current Ibb, and the logic state indicated by the first input signal (in this embodiment, the first input current Iin) and having a repetition frequency corresponding to a frequency of the first excitation current Ilo.

The second pulse train generation circuit (in this embodiment, the QFP/SFQ interface 62) includes a second Josephson junction (in this embodiment, for example, the Josephson junction J1 and the Josephson junction J2 shown in FIG. 3), and outputs a second pulse train (in this embodiment, the second SFQ pulse train Vclk) which is a pulse train generated by the second Josephson junction (in this embodiment, for example, the Josephson junction J1 and the Josephson junction J2 shown in FIG. 3) on the basis of the frequency of the first excitation current Ilo and having a repetition frequency corresponding to the frequency of the first excitation current Ilo.

The output pulse train generation circuit (in this embodiment, the D flip-flop 8) includes a third Josephson junction (in this embodiment, the Josephson junction not shown but included in the SFQ circuit), and outputs an output pulse train Vout in which a waveform of the first pulse train (in this embodiment, the first SFQ pulse train Vin) is shaped by the repetition frequency of the second pulse train (in this embodiment, the second SFQ pulse train Vclk).

In the qubit control circuit 1 according to this embodiment, since the logic circuit for outputting the output pulse train Vout having a repetition frequency corresponding to a predetermined frequency of the first excitation current Ilo is configured of a superconducting circuit, it is possible to realize a circuit configuration that curbs heat generation. The qubit control circuit 1 according to this embodiment has a circuit configuration that curbs heat generation, and thus can be placed inside a refrigerator. In other words, according to the qubit control circuit 1 of this embodiment, since even circuits that perform relatively complicated operations can be configured inside a refrigerator, the number of cables connecting the outside of the refrigerator to the circuits inside the refrigerator can be reduced. The qubit control circuit 1 can be used as a circuit that is a component constituting a qubit control circuit capable of controlling a large number of qubits with a small number of cables.

A specific example of the qubit control circuit capable of controlling a large number of qubits with a small number of cables will be described in a second embodiment.

Second Embodiment

Hereinafter, the second embodiment of the present invention will be described in detail with reference to the drawings.

In the above first embodiment, the case in which a pulse train is output as a signal for controlling a qubit, and the case in which a single frequency is included in the local oscillator signal have been described. In this embodiment, a case in which a plurality of frequencies are included in the local oscillator signal and pulse trains based on each of the frequencies are output will be described.

The qubit control circuit according to this embodiment is referred to as a qubit control circuit 1A.

Figure 5:
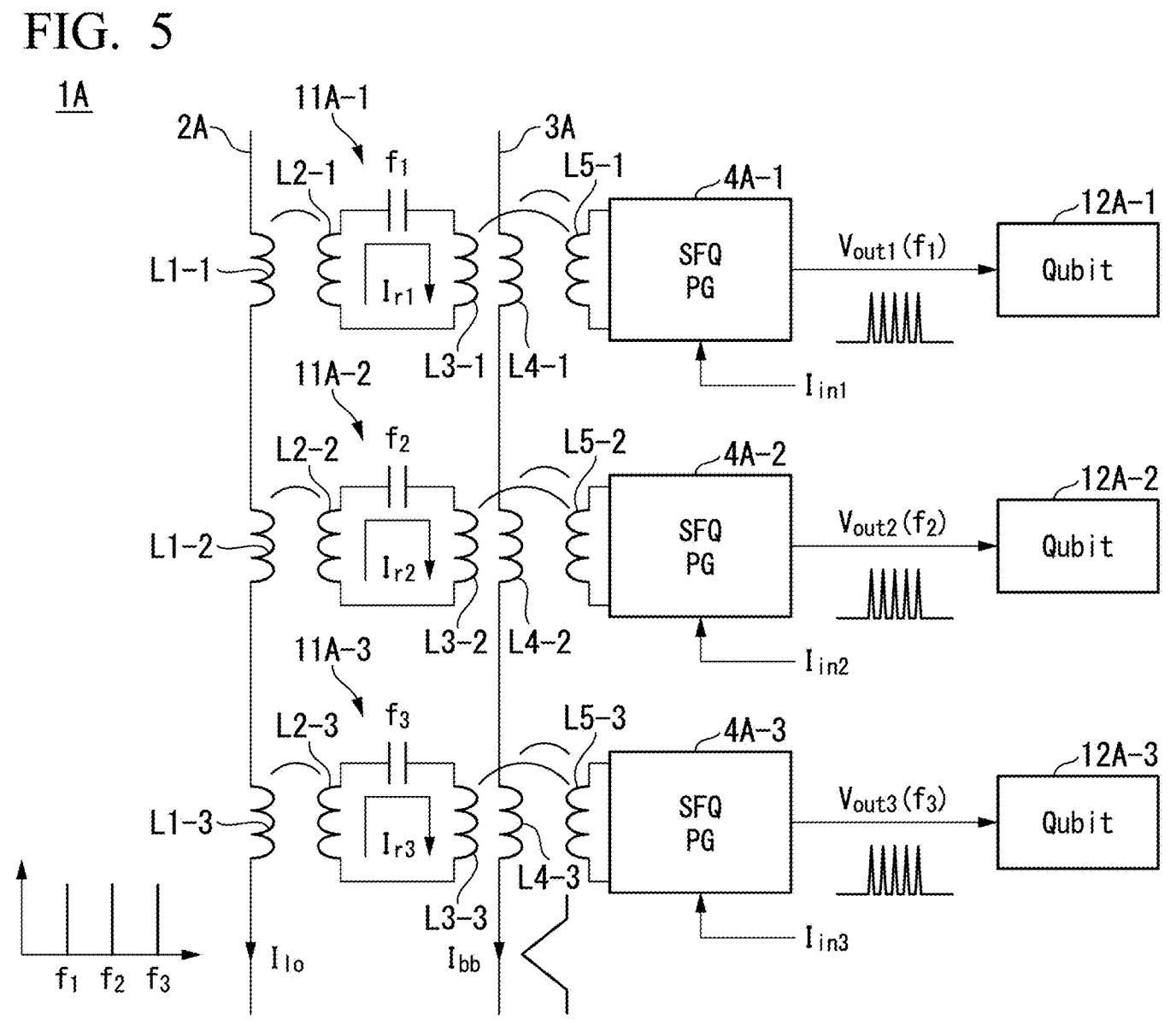

FIG. 5 is a diagram showing an example of a configuration of the qubit control circuit 1A according to this embodiment. The qubit control circuit 1A includes a first power supply line 2A, a second power supply line 3A, a resonant circuit 11A (a resonant circuit 11A-1, a resonant circuit 11A-2, a resonant circuit 11A-3), and an SFQ pulse generator 4A (an SFQ pulse generator 4A-1, an SFQ pulse generator 4A-2, an SFQ pulse generator 4A-3).

The first power supply line 2A is a power supply line through which a first excitation current Ilo is input. The first excitation current Ilo is a current including a plurality of frequencies. In other words, a plurality of frequencies are multiplexed and included in the first excitation current Ilo.

The plurality of frequencies included in the first excitation current Ilo are frequencies corresponding to a qubit 12A-1, a qubit 12A-2, and a qubit 12A-3 that are targets of control of the qubit control circuit 1A. In this embodiment, as an example, the first excitation current Ilo includes three frequencies including a frequency f1, a frequency f2, and a frequency f3.

The first power supply line 2A includes an inductor L1-1, an inductor L1-2, and an inductor L1-3.

The second power supply line 3A is a power supply line through which a second excitation current Ibb is input. The second excitation current Ibb is a current having a predetermined waveform. The second excitation current Ibb is a baseband signal supplied as an output signal from a baseband circuit. The waveform of the second excitation current Ibb flowing through the second power supply line 3A is, for example, a triangular wave, similar to the waveform of the second excitation current Ibb flowing through the second power supply line 3 shown in FIG. 1.

The second power supply line 3A includes an inductor L4-1, an inductor L4-2, and an inductor L4-3.

Each of the resonant circuit 11A-1, the resonant circuit 11A-2, and the resonant circuit 11A-3 extracts a specific frequency from the plurality of frequencies included in the first excitation current Ilo by resonance. The resonant circuit 11A-1, the resonant circuit 11A-2, and the resonant circuit 11A-3 have the same functions except that they have different resonance frequencies. Therefore, in the following, only the resonant circuit 11A-1 will be described, and descriptions of the resonant circuit 11A-2 and the resonant circuit 11A-3 will be omitted.

The resonant circuit 11A-1 is a circuit that resonates at a predetermined frequency (a resonance frequency). The resonance frequency is equal to any one of the plurality of frequencies included in the first excitation current Ilo. The resonant circuit 11A-1 is, for example, an LC circuit. The resonant circuit 11A-1 includes an inductor L2-1 and an inductor L3-1. The inductor L2-1 is magnetically coupled to the inductor L1-1 provided in the first power supply line 2A. The inductor L3-1 is magnetically coupled to an inductor L5-1 provided in the SFQ pulse generator 4A-1. When the first excitation current Ilo flows through the first power supply line 2A, the resonant circuit 11A-1 causes a current having a frequency at which the resonant circuit itself resonates, among the plurality of frequencies included in the first excitation current Ilo, to flow due to magnetic coupling between the inductor L2-1 and the inductor L1-1. Therefore, the resonant circuit 11A-1 extracts a frequency equal to its own resonance frequency from among the plurality of frequencies included in the first excitation current Ilo flowing through the first power supply line 2A.

In the following description, the current of the resonance frequency flowing through the resonant circuit 11A-1 is referred to as a component excitation current Ir1.

The SFQ pulse generators 4A (the SFQ pulse generator 4A-1, the SFQ pulse generator 4A-2, and the SFQ pulse generator 4A-3) are pulse generators that generate SFQ pulse trains. The SFQ pulse generator 4A-1, the SFQ pulse generator 4A-2, and the SFQ pulse generator 4A-3 have the same functions except that the resonance frequencies of the resonant circuits coupled thereto are different. Therefore, in the following, only the SFQ pulse generator 4A-1 will be described, and descriptions of the SFQ pulse generator 4A-2 and the SFQ pulse generator 4A-3 will be omitted.

The SFQ pulse generator 4A-1 is a pulse generator having a configuration that is the same as that of the qubit control circuit 1 shown in FIG. 1. In FIG. 5, the magnetic coupling between the SFQ pulse generator 4A-1 and another circuit element is abstractly represented by the inductor L5-1.

The SFQ pulse generator 4A-1 outputs an output pulse train Vout1 on the basis of the first excitation current Ilo, the second excitation current Ibb, and an input current Iin1. Here, the input current Iin1 corresponds to the first input current Iin shown in FIG. 1.

The SFQ pulse generator 4A-1 outputs an output pulse train Vout1 which is generated in accordance with the input current Iin1 that is input to an input signal line (not shown) due to the magnetic coupling between the inductor L5-1 and the inductor L3-1 included in the resonant circuit 11A-1 and the magnetic coupling between the inductor L5-1 and the inductor L4-1 provided in the second power supply line 3A when the component excitation current Ir1 flows through the resonant circuit 11A-1 and the second excitation current Ibb flows through the second power supply line 3A.

In FIG. 5, the magnetic coupling between the resonant circuit 11A-1 and the SFQ pulse generator 4A-1 is shown as being represented by the inductor L3-1 and the inductor L5-1, and the configuration corresponding to the plurality of inductors (the inductor L1 and the inductor L2 shown in FIG. 3 or FIG. 4) included in the QFP/SFQ interface (corresponding to the QFP/SFQ interfaces 61 and 62 shown in FIG. 1) constituting the SFQ pulse generator 4A-1 is abstractly shown by the inductor L5-1.

In addition, in FIG. 5, the magnetic coupling between the second power supply line 3A and the SFQ pulse generator 4A-1 is shown as being represented by the inductor L4-1 and the inductor L5-1, and the configuration corresponding to the plurality of inductors (the inductor L1 and the inductor L2 shown in FIG. 3 or FIG. 4) included in the QFP/SFQ interface (corresponding to the QFP/SFQ interfaces 61 and 62 shown in FIG. 1) constituting the SFQ pulse generator 4A-1 is abstractly represented by the inductor L5-1.

The input current Iin1 is supplied from a circuit provided separately from the qubit control circuit 1A.

In the qubit control circuit 1 shown in FIG. 1, two input signals (the first input current Iin and the second input current I1) are input, whereas in the SFQ pulse generator 4A-1 shown in FIG. 5, only one input signal (the input current Iin1) is shown. Two input signals are also input to the SFQ pulse generator 4A-1 shown in FIG. 5, similarly to the qubit control circuit 1 shown in FIG. 1. The input current Iin1 indicates one of the two input signals of which the logic state is not fixed (that is, the input signal corresponding to the first input current Iin). In the other one of the two input signals, the logic state is fixed to "1", similarly to the second input current I1. Similarly, for each of the SFQ pulse generator 4A-2 and the SFQ pulse generator 4A-3, only one of the two input signals (an input current Iin2 and an input current Iin3, respectively) is shown.

An output pulse train Vout1 having a repetition frequency f1 output by the SFQ pulse generator 4A-1 is irradiated onto a qubit 12A-1. The repetition frequency f1 of the output pulse train Vout1 is the same as a frequency f1 extracted by the resonant circuit 11A-1 from the first excitation current Ilo of which the frequency is multiplexed. That is, the SFQ pulse generator 4A-1 outputs, as an output signal, a pulse train having the repetition frequency f1 that is the same as the frequency f1 extracted from the first excitation current Ilo by the resonant circuit 11A-1.

Similarly, an output pulse train Vout2 having a repetition frequency f2 output by the SFQ pulse generator 4A-2 is irradiated onto a qubit 12A-2. The repetition frequency f2 of the output pulse train Vout2 is the same as the frequency f2 extracted by the resonant circuit 11A-2 from the first excitation current Ilo of which the frequency is multiplexed.

Similarly, an output pulse train Vout3 having a repetition frequency f3 output by the SFQ pulse generator 4A-3 is irradiated onto a qubit 12A-3. The repetition frequency f3 of the output pulse train Vout3 is the same as the frequency f3 extracted by the resonant circuit 11A-3 from the first excitation current Ilo of which the frequency is multiplexed.

In the qubit control circuit 1A, on and off states of the output pulse train Vout1, the output pulse train Vout2, and the output pulse train Vout3 are controlled by the logic states indicated by the input current Iin1, the input current Iin2, and the input current Iin3, respectively.

In the qubit control circuit 1A, the number of pulses included in the output pulse train Vout1, the output pulse train Vout2, or the output pulse train Vout3 can be controlled by adjusting the amplitude of each frequency component included in the first excitation current Ilo. That is, in the qubit control circuit 1A, the number of pulses included in each of the output pulse trains can be controlled by a spectrum of the first excitation current Ilo.

Figure 6:
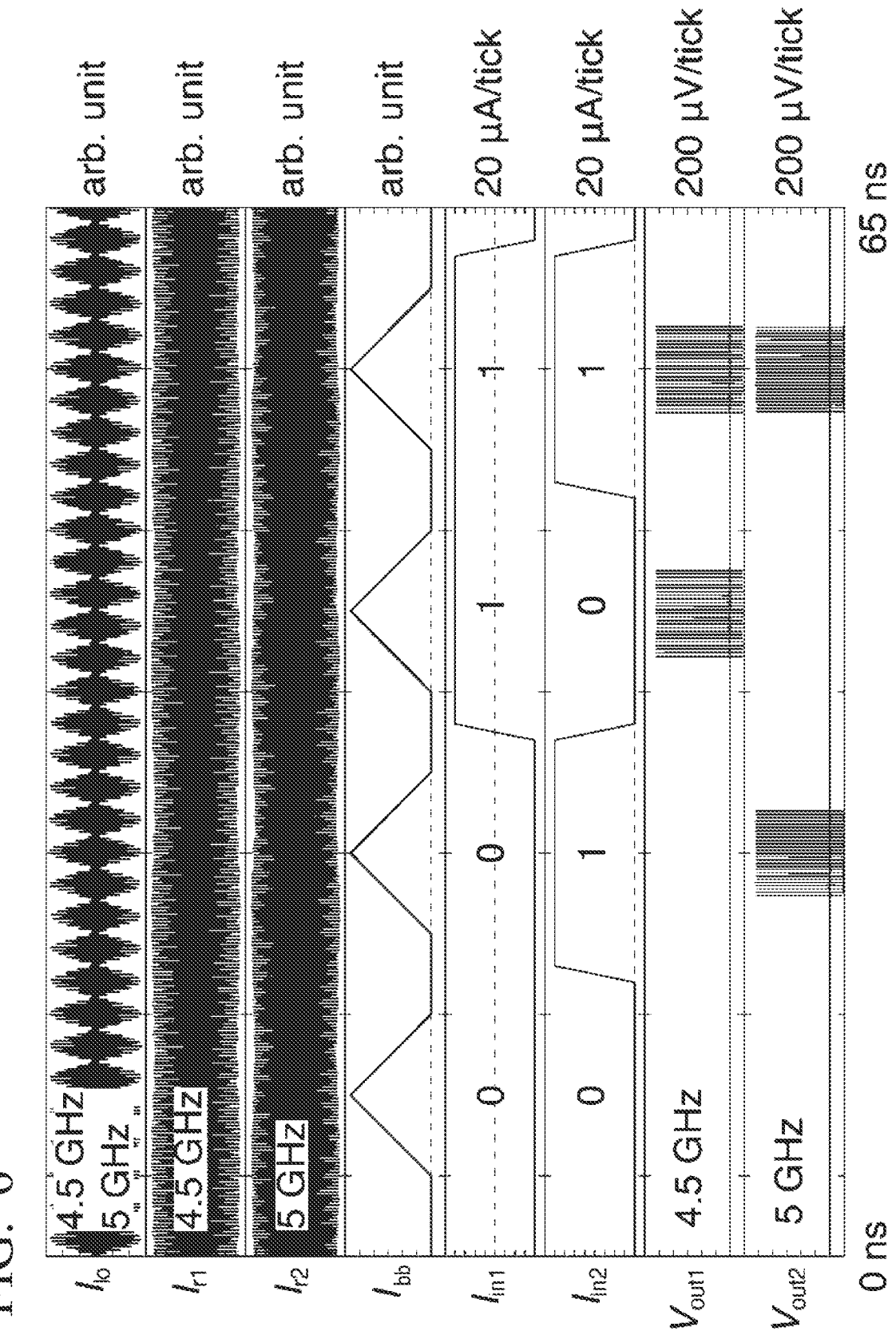
FIG. 6 is a diagram showing an example of a simulation result of the qubit control circuit according to the second embodiment of the present invention.

Next, a simulation result by the qubit control circuit 1A will be described with reference to FIG. 6. FIG. 6 is a diagram showing an example of a simulation result by the qubit control circuit 1A according to this embodiment. The simulation result shown in FIG. 6 is for a case in which the first excitation current Ilo includes two frequencies. In FIG. 6, values of each physical quantity are shown for 65 nanoseconds.

The first excitation current Ilo includes two frequencies of 4.5 GHz and 5 GHz. The frequency of the component excitation current Ir1 that flows through the resonant circuit 11A-1 due to resonance is 4.5 GHz. The frequency of the component excitation current Ir2 that flows through the resonant circuit 11A-2 due to resonance is 5 GHz. The second excitation current Ibb has a triangular wave. In FIG. 6, the values of the first excitation current Ilo, the component excitation current Ir1, the component excitation current Ir2, and the second excitation current Ibb are each expressed in an arbitrary unit.

The input current Iin1 input to the SFQ pulse generator 4A-1 indicates, as an example, logic states of "0, 0, 1, 1". The input current Iin2 input to the SFQ pulse generator 4A-2 indicates, as an example, logic states of "0, 1, 0, 1". In FIG. 6, the unit of each of the values of the input current Iin1 and the input current Iin2 is 20 μA/tick.

The output pulse train Vout1 is generated on the basis of the frequency component of 4.5 GHz included in the first excitation current Ilo, the second excitation current Ibb, and the input current Iin1. The output pulse train Vout1 is generated during a period corresponding to a period during which the logic state indicated by the input current Iin1 is "1". The repetition frequency of the output pulse train Vout1 is 4.5 GHz in accordance with the frequency component of 4.5 GHz included in the first excitation current Ilo.

The output pulse train Vout2 is generated on the basis of the frequency component of 5 GHz included in the first excitation current Ilo, the second excitation current Ibb, and the input current Iin2. The output pulse train Vout2 is generated during a period corresponding to a period during which the logic state indicated by the input current Iin2 is "1". The repetition frequency of the output pulse train Vout2 is 5 GHz in accordance with the frequency component of 5 GHz included in the first excitation current Ilo.

In FIG. 6, the unit of each of the values of the output pulse train Vout1 and the output pulse train Vout2 is 200 μV/tick.

As described above, of the two input signals input to the SFQ pulse generator 4A-1 one of which a logic value is not fixed is the input current Iin1, and in the other one, the logic value is fixed. FIG. 6 shows the simulation result when the logic value of the other input signal is "1". Since the logic state of the other input signal is fixed to "1," the output pulse train Vout1 is output when the logic value of the input current Iin1 is "1," and the output pulse train Vout1 is not output when the logic value of the input current Iin1 is "0". The same applies to the relationship between the input current Iin2 and the output pulse train Vout2.

Figure 7:
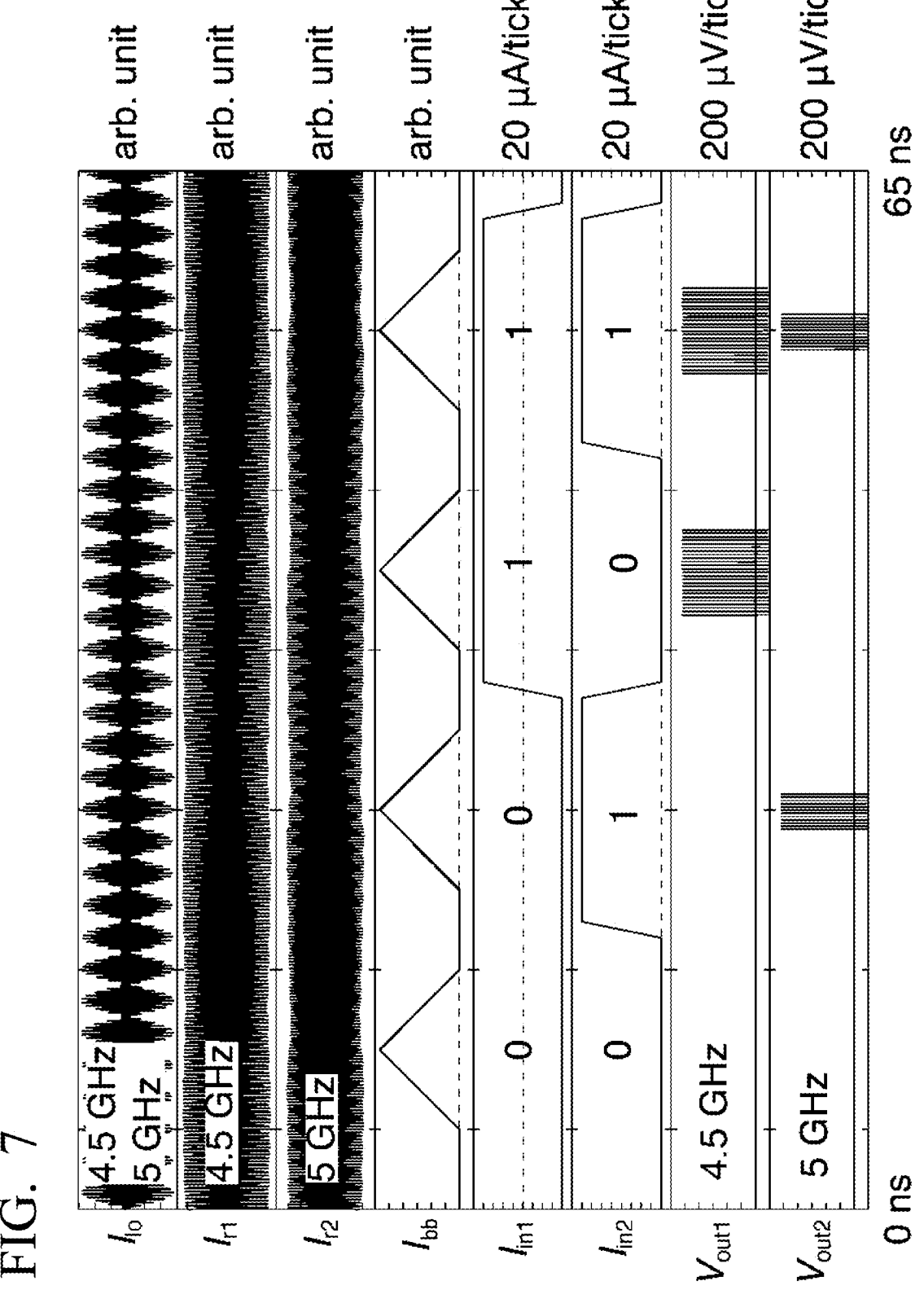
FIG. 7 is a diagram showing an example of a relationship between a spectrum of a first excitation current and the number of pulses of an output pulse according to the second embodiment of the present invention.

The number of pulses in the output pulse train can be controlled by the spectrum of the first excitation current Ilo. Here, with reference to FIG. 7, the control of the number of pulses in the output pulse train by the spectrum of the first excitation current Ilo will be described. FIG. 7 is a diagram showing an example of the relationship between the spectrum of the first excitation current Ilo and the number of pulses in the output pulse train according to this embodiment.

The amplitude of the frequency component of 5 GHz is reduced in the first excitation current Ilo shown in FIG. 7 compared to the first excitation current Ilo shown in FIG. 6. The power of the frequency component of 5 GHz is −51.4 dBm for the first excitation current Ilo shown in FIG. 6, whereas it is −52.9 dBm for the first excitation current Ilo shown in FIG. 7. The amplitude of the frequency component of 4.5 GHz is −51.9 dBm for both the first excitation current Ilo shown in FIG. 6 and the first excitation current Ilo shown in FIG. 7.

In accordance with the reduction in the amplitude of the frequency component of 5 GHz included in the first excitation current Ilo, the number of pulses in the output pulse train Vout2 is reduced. The reason why the number of pulses in the output pulse train Vout2 is reduced is because a threshold value of the second excitation current Ibb for outputting the output pulse train Vout2 becomes large. Since the amplitude of the frequency component of 4.5 GHz included in the first excitation current Ilo is not changed, the number of pulses in the output pulse train Vout1 is not changed.

Summary of the Second Embodiment

As described above, in the qubit control circuit 1A according to this embodiment, the first excitation current Ilo input to the first power supply line 2A includes a plurality frequencies (in this embodiment, the frequency f1, the frequency f2, and the frequency f3).

The qubit control circuit 1A according to this embodiment includes a set (in this embodiment, the SFQ pulse generator 4A) of a first pulse train generation circuit (in this embodiment, not shown and corresponding to the QFP/SFQ interface 61 in FIG. 1), a second pulse train generation circuit (in this embodiment, not shown and corresponding to the QFP/SFQ interface 62 in FIG. 1) and an output pulse train generation circuit (in this embodiment, not shown and corresponding to the D flip-flop 8 in FIG. 1), and a resonant circuit 11A for each of a plurality of frequencies (in this embodiment, the frequency f1, the frequency f2, and the frequency f3).

A resonant circuit (in this embodiment, the resonant circuit 11A-1, the resonant circuit 11A-2, and the resonant circuit 11A-3) has a resonance frequency that is one of a plurality of frequencies (in this embodiment, the frequency f1, the frequency f2, and the frequency f3) included in the first excitation current Ilo, and supplies the resonance frequency as the frequency of the first excitation current Ilo to the first pulse train generation circuit (in this embodiment, not shown and corresponding to the QFP/SFQ interface 61 in FIG. 1) and the second pulse train generation circuit (in this embodiment, not shown and corresponding to the QFP/SFQ interface 62 in FIG. 1).

With this configuration, in the qubit control circuit 1A according to this embodiment, regardless of the number of qubits, the number of cables required to control the qubits is two including the first power supply line 2A and the second power supply line 3A, and thus a large number of qubits can be controlled with a small number of cables. Here, a small number of cables means that the number is smaller than the number of qubits to be controlled.

In this embodiment, the example in which the first excitation current Ilo includes three frequencies has been described, but the present invention is not limited thereto. The first excitation current Ilo may include one, two, or four or more frequencies in accordance with the number of qubits to be controlled. The qubit control circuit includes at least a set of a first pulse train generation circuit, a second pulse train generation circuit, and an output pulse train generation circuit, the number of which is equal to or greater than the number of frequencies included in the first excitation current Ilo, and a set of resonant circuits (in this embodiment, a set of the SFQ pulse generator 4A and the resonant circuit 11A). Among the set of the first pulse train generation circuit, the second pulse train generation circuit, and the output pulse train generation circuit, and the set of the resonant circuits (in this embodiment, the set of the SFQ pulse generator 4A and the resonant circuit 11A) included in the qubit control circuit, there may be some that are not used. Furthermore, a plurality of sets of the first pulse train generation circuit, the second pulse train generation circuit, and the output pulse train generation circuit and sets of the resonant circuits (in this embodiment, the set of the SFQ pulse generator 4A and the resonant circuit 11A) may correspond to a certain frequency included in the first excitation current Ilo.

In this embodiment, the example in which the resonant circuit and the power supply line (the first power supply line) are coupled by magnetic coupling has been described, but the present invention is not limited thereto. The resonant circuit and the power supply line may be coupled by capacitive coupling.

In each of the above-described embodiments, the QFP provided in the qubit control circuit may be an adiabatic QFP (AQFP) or a directly coupled QFP (DQFP).

In each of the above-described embodiments, the example in which the electromagnetic wave generated by the qubit control circuits 1 and 1A and irradiated to the control target (the qubit) is a microwave has been described, but the present invention is not limited thereto. The frequency of the electromagnetic wave generated by the qubit control circuits 1 and 1A and irradiated to the control target (the qubit) may be other than the frequency of the microwave. In other words, the qubit control circuits 1 and 1A may generate electromagnetic waves having a frequency other than the frequency of the microwave and may irradiate the control target.

As described above, in each of the above-described embodiments, the qubit control circuit may include an SFQ circuit. Various logics are known for the SFQ circuit, and when the qubit control circuit includes an SFQ circuit in each of the embodiments, any logic may be used for the SFQ circuit. Examples of the logic for the SFQ circuit include rapid single-flux-quantum (RSFQ), low-voltage RSFQ (LV-RSFQ), energy-efficient RSFQ (ERSFQ), energy-efficient SFQ (eSFQ), reciprocal quantum logic (RQL), flux shuttle, and the like.

In each of the above-described embodiments, the example in which the control target of the qubit control circuit is a qubit has been described, but the present invention is not limited thereto. A control target other than the qubit may be controlled by a circuit having a configuration that is the same as that of the qubit control circuit according to each of the above-described embodiments. The control target other than qubit includes, for example, various components that constitute circuits of a quantum computer.

Although one embodiment of the present invention has been described in detail above with reference to the drawings, the specific configuration is not limited to the above, and various design changes and the like are possible within the scope that does not deviate from the gist of the present invention.

REFERENCE SIGNS LIST 1, 1A Qubit control circuit
2, 2A First power supply line
3, 3A Second power supply line
Ilo First excitation current
Ibb Second excitation current
11A Resonant circuit
51 First input signal line
52 Second input signal line
61, 62 QFP/SFQ interface
8 D flip-flop
Iin First input current
I1 Second input current
Vin First SFQ pulse train
Vclk Second SFQ pulse train
Vout Output pulse train

The invention claimed is:

1. A qubit control circuit comprising:
a first power supply line through which a first excitation current, which is a current having a predetermined frequency, is input;
a second power supply line through which a second excitation current, which is a current having a predetermined waveform, is input;
a first input signal line through which a first input signal indicating a logic state is input;

a first pulse train generation circuit including a first Josephson junction and configured to output a first pulse train which is a pulse train generated by the first Josephson junction on the basis of the predetermined frequency of the first excitation current, the waveform of the second excitation current, and the logic state indicated by the first input signal, the first pulse train having a repetition frequency corresponding to the predetermined frequency;
a second pulse train generation circuit including a second Josephson junction and configured to output a second pulse train which is a pulse train generated by the second Josephson junction on the basis of the predetermined frequency of the first excitation current, the second pulse train having a repetition frequency corresponding to the predetermined frequency; and
an output pulse train generation circuit including a third Josephson junction and configured to output an output pulse train in which a waveform of the first pulse train is shaped by the repetition frequency of the second pulse train.

2. The qubit control circuit according to claim 1, further comprising a second input signal line through which a second input signal indicating a predetermined logic state is input, and a third power supply line through which a third excitation current that is a direct current having a predetermined magnitude is input,
wherein the second pulse train generation circuit outputs, as the second pulse train, a pulse train generated by the second Josephson junction on the basis of the predetermined frequency of the first excitation current and a DC waveform of the third excitation current.

3. The qubit control circuit according to claim 1, wherein the first excitation current input to the first power supply line includes a plurality of frequencies,
a set of the first pulse train generation circuit, the second pulse train generation circuit, and the output pulse train generation circuit, and a resonant circuit are provided for each of the plurality of frequencies, and
the resonant circuit has a resonance frequency that is one of the plurality of frequencies included in the first excitation current and supplies the resonance frequency as the predetermined frequency of the first excitation current to the first pulse train generation circuit and the second pulse train generation circuit.

4. The qubit control circuit according to claim 1, wherein the number of pulses in the output pulse train output by the output pulse train generation circuit is controlled by an amplitude of the first excitation current.

5. The qubit control circuit according to claim 1, wherein the first pulse train generation circuit and the second pulse train generation circuit include at least one of a flux quantum parametron circuit configuration and a single flux quantum circuit configuration.

* * * * *